United States Patent
Bleeker

(10) Patent No.: US 7,002,666 B2
(45) Date of Patent: Feb. 21, 2006

(54) LITHOGRAPHIC APPARATUS AND DEVICE MANUFACTURING METHOD

(75) Inventor: Arno J. Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 89 days.

(21) Appl. No.: 10/825,628

(22) Filed: Apr. 16, 2004

(65) Prior Publication Data

US 2005/0231701 A1 Oct. 20, 2005

(51) Int. Cl.
*G03B 27/42* (2006.01)
*G03B 27/54* (2006.01)
*G03B 27/32* (2006.01)
*G03C 5/00* (2006.01)
*G02F 1/07* (2006.01)

(52) U.S. Cl. ............................. 355/53; 355/67; 355/77; 359/245; 430/311

(58) Field of Classification Search ................. 355/53, 355/67, 77; 359/245, 291; 430/311
See application file for complete search history.

(56) References Cited

U.S. PATENT DOCUMENTS

| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,667,077 B1 * | 12/2003 | Oaku et al. .................. 428/1.1 |
| 6,687,041 B1 | 2/2004 | Sandstrom |
| 6,747,783 B1 | 6/2004 | Sandstrom |
| 6,795,169 B1 | 9/2004 | Tanaka et al. |
| 6,806,897 B1 | 10/2004 | Kataoka et al. |
| 6,811,953 B1 | 11/2004 | Hatada et al. |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| WO | WO 98/330986 | 7/1998 |
| WO | WO 98/38597 | 9/1998 |

* cited by examiner

*Primary Examiner*—Alan Mathews
(74) *Attorney, Agent, or Firm*—Sterne, Kessler, Goldstein & Fox P.L.L.C.

(57) ABSTRACT

A lithographic apparatus includes a patterning device that patterns a projected beam. The patterning device includes an array of cells that contain a polar fluid, a non-polar fluid, and an electrode. A potential difference across the electrode and the polar fluid causes displacement of the non-polar fluid. Based on a difference in refractive index between the polar fluid and the non-polar fluid, a beam of light which passes through the cell will have its phase changed in dependence on the relative thickness on the polar and non-polar fluids and on their refractive indices.

10 Claims, 2 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays and other devices involving fine structures. In a conventional lithographic apparatus, a patterning device, which is alternatively referred to as a mask or a reticle, may be used to generate a circuit pattern corresponding to an individual layer of the IC (or other device). This pattern can be imaged onto a target portion (e.g., part of one or several dies) on a substrate (e.g., a silicon wafer or glass plate) that has a layer of radiation-sensitive material (e.g., resist). Instead of a mask, the patterning device may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (e.g., the "scanning" direction), while synchronously scanning the substrate parallel or anti parallel to this direction.

The individually controllable elements that generate the pattern in the patterning device may take several forms. Conventionally, there are two types of pure-phase modulating individually controllable elements. A first type is based on a reflective layer placed on a compliant layer. A second type is based on individual micro-mirrors that can be moved in a direction perpendicular to their reflecting surface.

However, both of these types of individually controllable elements are difficult to manufacture and are not efficient in accurate pattern placement when trying to also maintain pattern fidelity. This is largely because of they require mechanical motion for arrays of very small individually controllable elements.

Therefore, what is needed is a system and method that can provide a pure phase-shifting array of individually controllable elements that is capable of accurate edge placement without loss of pattern fidelity.

SUMMARY OF THE INVENTION

One embodiment of the present invention provides a lithographic apparatus including an illumination system for supplying a projection beam of radiation, a patterning array having individually controllable elements that impart the projection beam with a pattern, a substrate table for supporting a substrate during an exposure process, and a projection system for projecting the patterned beam onto a target portion of the substrate. The individually controllable elements each comprise a cell containing a polar fluid, a non-polar fluid, and a voltage source arranged to apply selectively an electric field across the cell for voltage-controlled displacement of the non-polar fluid within the cell. The polar fluid and the non-polar fluid have substantially the same transmissivity, but different refractive indices.

Through the use of an array of cells containing polar and non-polar fluids little or no mechanical motion is required. Thus, there is no need for actuators, which can be bulky and difficult to control accurately. Each cell receives a voltage across different parts of the cell. The extent of displacement of non-polar fluid may then be controlled by this voltage. The ratio of polar to non-polar fluid in the line of the projection beam changes the phase of the part of the projected beam associated with the cell by a desired amount as it passes through the cell. Because the voltage can be controlled accurately, the displacement of the non-polar fluid can be changed accurately, thereby giving a pure phase-shifting individually controllable element that is capable of accurate edge placement without loss of pattern.

The voltage source is adapted to change the voltage level to give a desired level of attraction on the polar fluid, thereby displacing the non-polar fluid by a desired amount. In this way, the attraction of the polar fluid towards one part of the cell may cause the displacement of the non-polar fluid towards a different part of the cell.

The relative properties of the polar and non-polar fluids are chosen to change the phase of the projected beam of radiation as desired. This is done by having different refractive indices for the different fluids. As the beam passes first into one fluid and then the other, the change in refractive index causes the properties of the beam to change. The phase change of the part of the beam that passes through the cell is proportional to the difference in refractive index of the fluids through which it passes.

In one example, the polar fluid is water and the non-polar fluid is oil. In this example, these fluids are chosen because they are immiscible and so the movement of one will displace the other. These fluids are also simple and inexpensive to acquire and/or maintain.

The cell may comprise a reflective surface on the opposite surface from the radiation entry surface, such that the part of the projected beam associated with the cell travels through the cell twice. Directing the projected beam through the cell twice via a reflective surface can result in the projected beam phase being changed by twice as much with the same displacement of the non-polar fluid as a cell without the reflective surface, which simply transmits the projected beam through it once.

A second embodiment of the present invention provides a device manufacturing method comprising the steps of providing a substrate, providing a projection beam of radiation using an illumination system, using a patterning array comprising individually controllable elements to impart the projection beam with a pattern, projecting the patterned beam of radiation onto a target portion of the substrate, and controlling the phase of the part of the beam associated with each element by directing it through a cell containing layers of polar and non-polar fluids, the fluids having substantially the same transmissivity, but different refractive indices and having adjustable relative layer thicknesses.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE INVENTION

Overview and Terminology

Figure 1:
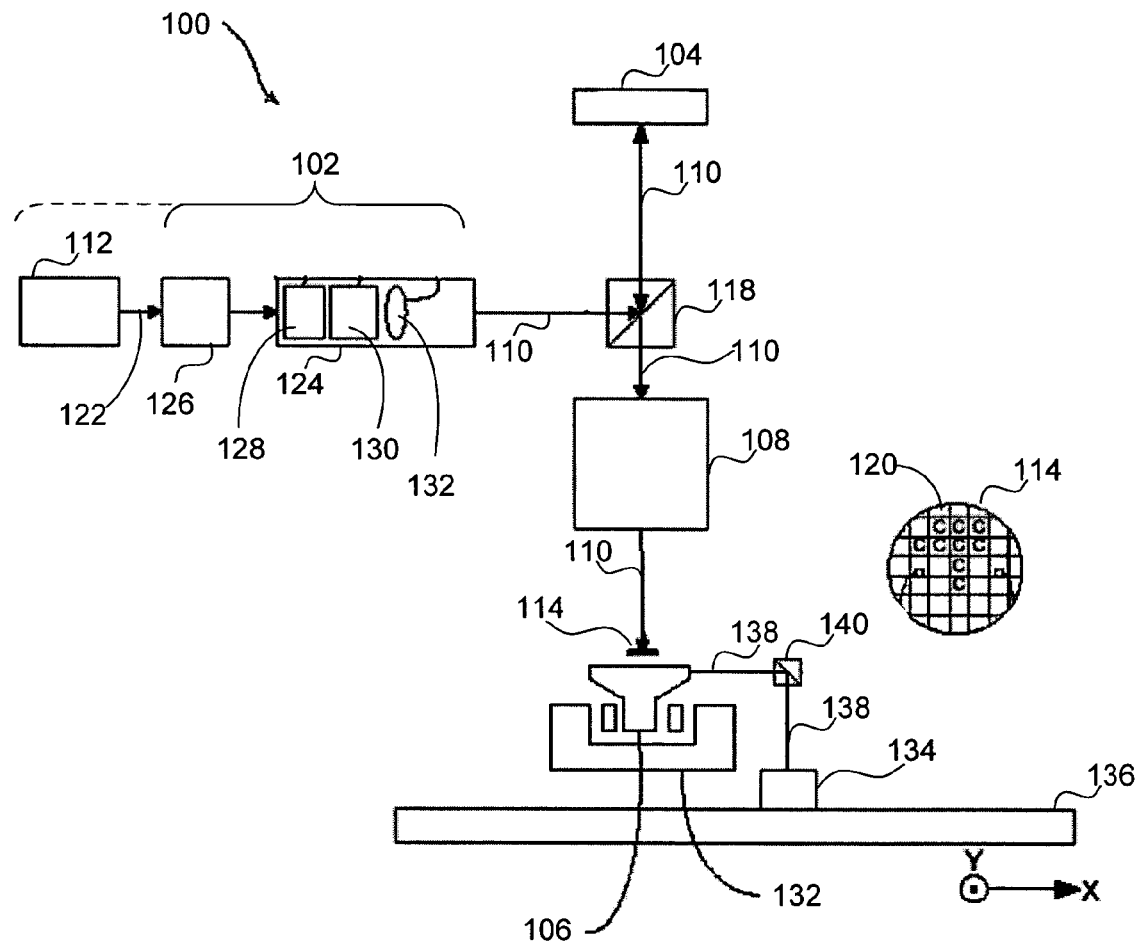
FIG. 1 depicts a lithographic apparatus according to one embodiment of the present invention.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a projection beam 110 of radiation (e.g., UV radiation), which in this particular case also comprises a radiation source 112.

An array of individually controllable elements 104 (e.g., a programmable mirror array) can be used for applying a pattern to projection beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist-coated silicon wafer or glass substrate) and object table 106 can be connected to a positioning device 116 for accurately positioning substrate 114 with respect to projection system 108.

Projection system 108 (e.g., a quartz and/or CaF$_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on the array of individually controllable elements 104 has a desired uniformity and intensity distribution in its cross-section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that projection beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned projection beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned projection beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned projection beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned projection beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned projection beam 110 scans across substrate 114 and exposes it.

Combinations and/or variations on the above described modes of use or entirely different modes of use may also be employed.

Exemplary Imaging Arrangements

Figure 2:
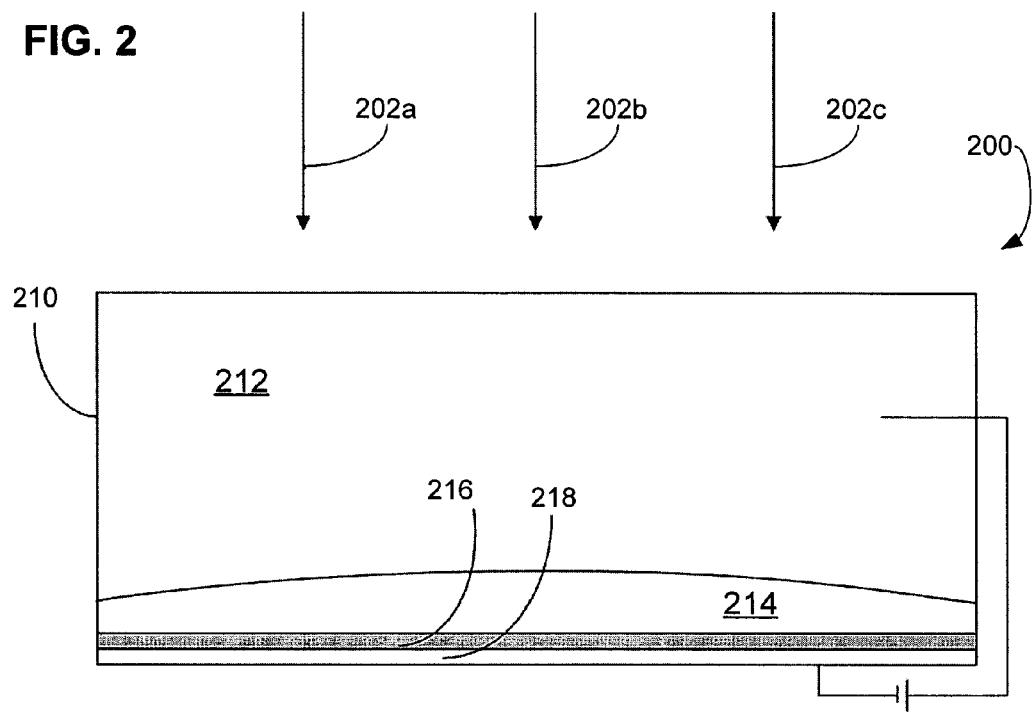
FIGS. 2 and 3 depict an individually controllable element in first and second states according to one embodiment of the present invention.

FIG. 2 shows an individually controllable element 200 in a first state, according to one embodiment of the present invention. In this embodiment, individually controllable element 200 is in the form of a cell 210 containing a polar fluid 212, for example water, and a non-polar fluid 214, for example oil. Cell 210 also contains an electrode 218, which can have a potential difference applied between it and polar fluid 212. There is also an insulating layer 216 to insulate electrode 218 from fluids 212, 214.

In this embodiment, an incoming projected radiation beam 202 (202a, 202b, 202c, . . . ) is transmitted to pass through polar fluid 212 and non-polar fluid 214. Passing through fluids 212 and 214 changes a phase of projected radiation beam 202.

In one example, the phase is changed in accordance with the following formula:

$$\Delta\phi = 2\pi nd/\lambda(n1-n2)$$

where $\Delta\phi$=change in phase;

d=the thickness of the non-polar fluid 214;

$\lambda$=wavelength of the radiation beam 202;

n1=refractive index of the non-polar fluid 214; and n2=refractive index of the polar fluid 212.

For example, if d=1 $\mu$m, n1−n2=0.1, and $\lambda$=193 nm, the phase difference will be approximately $\pi$. In a system using a reflective individually controllable element 200, the phase difference will be $2\pi$.

Figure 3:
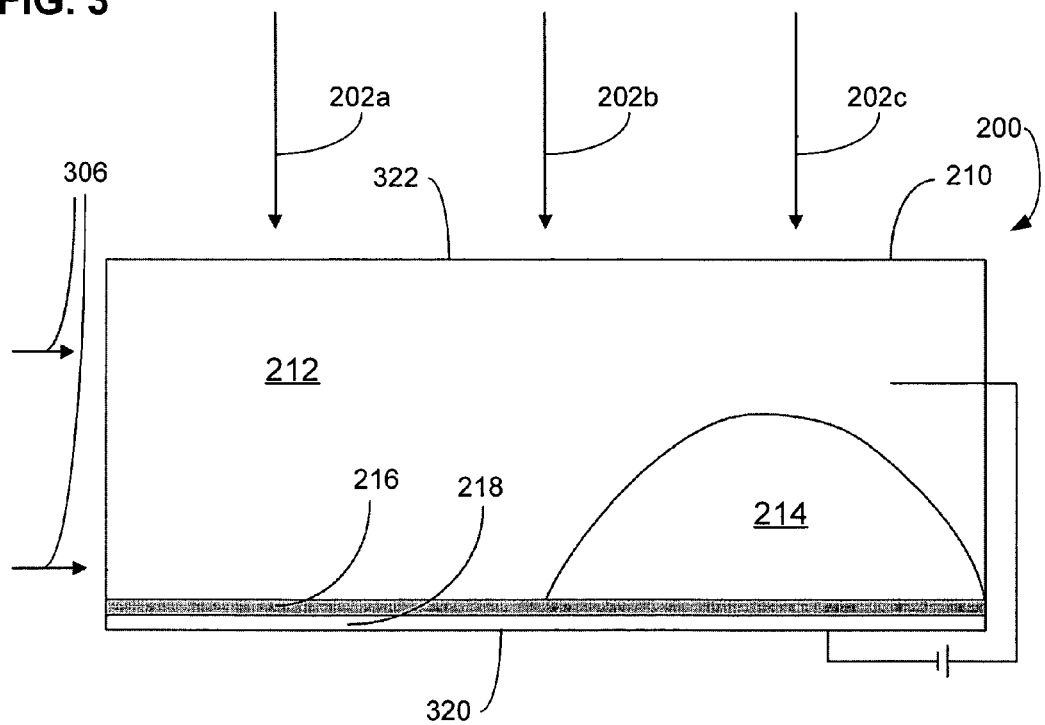

FIG. 3 shows cell 210 in a second state, which is when a potential difference is applied across electrode 218 and polar fluid 212. The potential difference causes polar fluid 212 to be attracted to electrode 218. This causes displacement of non-polar fluid 214 as shown in the figure. This process is known as "electrowetting" because the insulating surface becomes more or less "wettable" depending on the voltage applied across cell 210. For example, electrode 218 changes the wettability of surface layer 216 basically determining a contact angle between surface layer 216, and thus a shape of a fluid interface. The counter "electrode" is polar fluid 212.

In this example, projected radiation beam 202c is projected through a different ratio of polar fluid 212 to non-polar fluid 214 as compared to projected radiation beam 202c in FIG. 2. As noted in the formula above, in this example the phase change will change in proportion with the value of d, that is, the thickness of non-polar fluid 214.

Projected radiation beam 202a, on the other hand, no longer passes through non-polar liquid 214 (or through as much non-polar liquid 214), so the phase change should be dependent on its passage through polar liquid 212.

FIG. 3 also shows an alternative embodiment having a different input direction for a projected radiation beam 306. In this embodiment, only projection radiation beam 306 would be passing through cell 210, and not projection radiation beam 202. A relative thickness of non-polar fluid 214 and polar fluid 212 can be achieved in order to change the phase of projected radiation beam 306 by a different amount.

In another alternative embodiment, when cell 210 is used as a reflective individually controllable element 200, the reflective surface can be on an opposite face 320 of cell 210 from a face 322 in which projected radiation beam 202 is input. In one example, this allows projection radiation beam 202 to pass twice through cell 210. It is to be appreciated that any internal surface of cell 210 can be the reflective surface because projected radiation beam 202 is projected through materials with different refractive indices, which changes the phase of the beam, not just the order in which it passes through them. For example, in this embodiment the reflective surface forms part of insulating layer 216. It is to be appreciated other areas of cell 210 can also be or include the reflective surface, which are all contemplated within the scope of the present invention.

It is to be appreciated alternative embodiments may include having electrode 218 on a different surface of cell 210 and in different configurations, as long as non-polar fluid 214 and polar fluid 212 are relatively displaced by the potential difference described above.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that supplies a projection beam of radiation;
   a patterning array including individually controllable elements that impart the projection beam with a pattern, each of the individually controllable elements include a cell containing a polar fluid, a non-polar fluid, an electrode, and a voltage source;
   a substrate table that supports a substrate during an exposure operation; and
   a projection system that projects the patterned beam onto a target portion of the substrate.

2. The lithographic apparatus of claim 1, wherein the polar fluid, the non-polar fluid, the electrode, and the voltage source are arranged to selectively apply an electric field across the cell for voltage-controlled displacement of said non-polar fluid within the cell.

3. The lithographic apparatus of claim 2, wherein the polar fluid and the non-polar fluid have substantially the same transmissivity, but different refractive indices.

4. The lithographic apparatus of claim 1, wherein the polar fluid and the non-polar fluid have substantially the same transmissivity but different refractive indices.

5. The lithographic apparatus of claim 1, wherein the relative properties of the polar and non-polar fluids are chosen to change a phase of part of the projection beam of radiation associated with the cell by a predetermined amount relative to other parts of the projected beam depending on a level of applied voltage by the voltage source.

6. The lithographic apparatus of claim 1, wherein the polar fluid is water.

7. The lithographic apparatus of claim 1, wherein the non-polar fluid is oil.

8. The lithographic apparatus of claim 1, wherein the cell comprises a reflective surface on an opposite inside surface of the cell from a radiation entry surface, such that the projection beam of radiation travels through the cell twice.

9. A device manufacturing method, comprising:
   forming each of individually controllable elements in an array of individually controllable elements with a cell containing a polar fluid, a non-polar fluid, an electrode, and a voltage source;
   using the array of individually controllable elements to impart a projection beam with a pattern; and
   projecting the patterned beam of radiation onto a target portion of a substrate.

10. The method of claim 9, further comprising:
    controlling a phase of a part of the projection beam associated with each element relative to the rest of the projected beam by directing the projection beam through the cell containing layers of the polar and the non-polar fluids, which have one or both of substantially a same transmissivity, but different refractive indices, or adjustable relative layer thicknesses.

* * * * *

UNITED STATES PATENT AND TRADEMARK OFFICE
CERTIFICATE OF CORRECTION

PATENT NO. : 7,002,666 B2
APPLICATION NO. : 10/825628
DATED : February 21, 2006
INVENTOR(S) : Arno J. Bleeker It is certified that error appears in the above-identified patent and that said Letters Patent is hereby corrected as shown below:

Title page,
Item [56], References Cited, FOREIGN PATENT DOCUMENTS,
"WO 98/330986" should be -- WO 98/33096 --.

Column 7,
Line 60, "$\Delta\Phi=2\pi nd/\lambda(n1-n2)$" should be -- $\Delta\Phi=2\pi d/\lambda(n1-n2)$ --.

Signed and Sealed this

Twentieth Day of June, 2006

JON W. DUDAS
*Director of the United States Patent and Trademark Office*